United States Patent [19]

Watanabe et al.

[11] 4,258,379

[45] Mar. 24, 1981

[54] IIL WITH IN AND OUTDIFFUSED EMITTER POCKET

[75] Inventors: Tomoyuki Watanabe, Kodaira; Takahiro Okabe, Hinodemachi; Minoru Nagata, Kodaira; Tohru Nakamura, Hoya; Kenji Kaneko, Hachioji; Yutaka Okada, Kokubunji; Norio Anzai, Tokorozawa; Takanori Nishimura, Mitaka; Takashi Agatsuma, Kodaira, all of Japan

[73] Assignee: Hitachi, Ltd., Japan

[21] Appl. No.: 78,452

[22] Filed: Sep. 24, 1979

[30] Foreign Application Priority Data

Sep. 25, 1978 [JP] Japan .................... 53-130299

[51] Int. Cl.$^3$ .................... H01L 27/04; H03K 19/091
[52] U.S. Cl. .................... 357/44; 357/43; 357/46; 357/89; 357/92
[58] Field of Search .................... 357/44, 46, 92, 89, 357/90, 91

[56] References Cited

U.S. PATENT DOCUMENTS

| | | | |
|---|---|---|---|
| 3,709,746 | 1/1973 | de Witt | 357/89 |
| 3,756,873 | 9/1973 | Kaiser | 357/89 |
| 4,045,251 | 8/1977 | Graul et al. | 357/92 |
| 4,118,251 | 10/1978 | Murrmann et al. | 357/91 |
| 4,132,573 | 1/1979 | Kraft | 357/89 |
| 4,144,098 | 3/1979 | Rosner | 357/89 |
| 4,149,906 | 4/1979 | de la Moneda | 357/91 |
| 4,202,006 | 5/1980 | Khajezadeh | 357/89 |
| 4,203,126 | 5/1980 | Yim et al. | 357/89 |

FOREIGN PATENT DOCUMENTS 51-116687 10/1976 Japan.

OTHER PUBLICATIONS

Allstot et al., 1977, IEEE, Int. Electron Dev. Meeting, Tech. Digest, pp. 175-177, Dec. 1975.
IEEE, J. of Solid State Circuits, Oct. 1972, pp. 340-351.

Primary Examiner—William D. Larkins
Attorney, Agent, or Firm—Craig & Antonelli

[57] ABSTRACT

A semiconductor IC device in which an N-type semiconductor layer is formed in a P-type semiconductor substrate; the N-type layer is divided by a P$^+$-type insulation region into plural island regions; and an IIL is formed in a first island region while an NPN transistor is formed in a second island region, wherein an N-type up-diffused layer is formed from the bottom of the first island region up while an N-type well region is formed from the surface of the first island region down, and N$^+$-type buried layers are formed near the bottoms of the first and the second island region.

14 Claims, 21 Drawing Figures

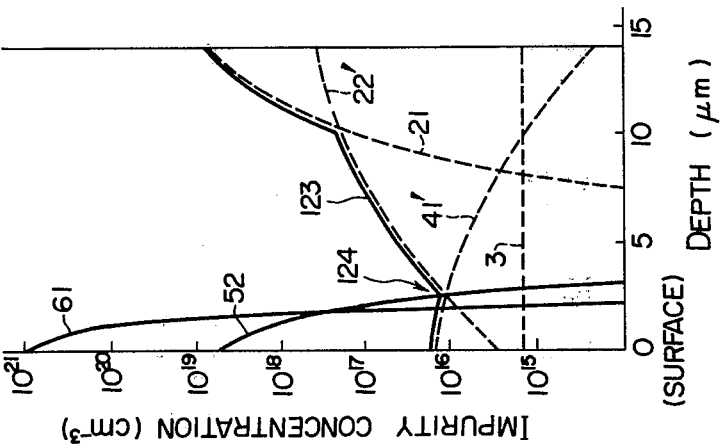
F I G. 12A
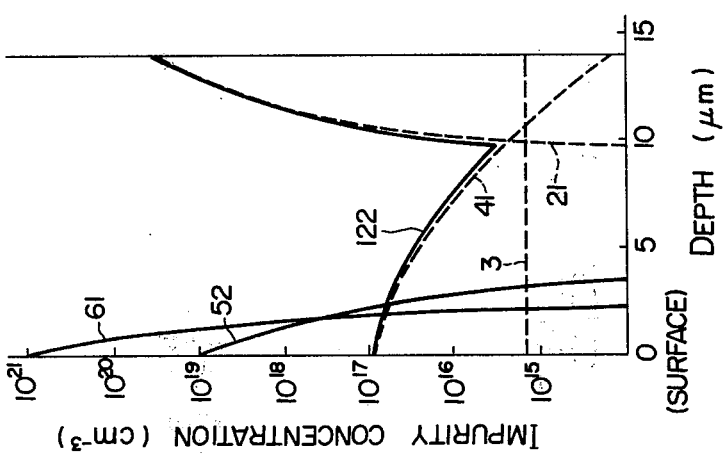
F I G. 12B
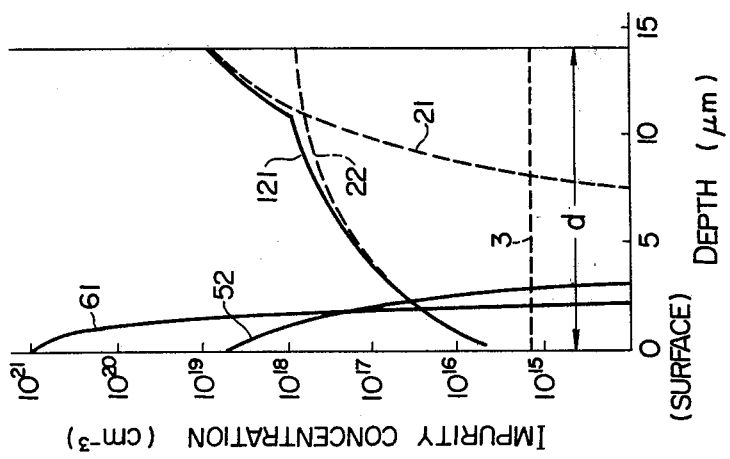
F I G. 12C

IIL WITH IN AND OUTDIFFUSED EMITTER POCKET

BACKGROUND OF THE INVENTION

1. Field of the Invention

This invention relates to a semiconductor integrated circuit in which an integrated injection logic device (hereafter referred to as IIL) and other semiconductor devices are integrated on a monolithic semiconductor chip.

2. Description of the Prior Art

Integrated injection logic devices (IIL: H. H. Berger and S. K. Wiedmann: "Merged-Transistor Logic (MTL)—A Low-Cost Bipolar Logic Concept", IEEE J. of SSC, sc-7, 5, p. 340–346 (1972, Oct.); K. Hart & A. Slob: "Integrated Injection Logic—A New Approach to LSI" IEEE J. of SSC, sc-7, 5, p. 346–351 (1972, Oct.)) are now widely used in practice as bipolar logic devices having a high packing density and consuming only small power for operation. The IIL also has a noteworthy advantage that it can be formed on a monolithic semiconductor chip on which a bipolar IC having a conventional constitution is to be formed. On the other hand, the IC having an thin epitaxial-grown semiconductor layer whose small thickness is optimal for the integration of an IIL, has a drawback that the breakdown voltage of the incorporated NPN transistor is usually reduced to less than 10 V. In the case, however, where an IIL and, for example, a linear circuit are integrated on a single semiconductor chip, it is often necessary for the NPN transistors used in the linear section or the driver section to have a breakdown voltage in a range of 15 V–60 V or more. Accordingly, the NPN transistors which are formed along with an IIL on the same chip, must have higher breakdown voltages.

It is also necessary to increase the operational speed of the IIL. The IIL usually has a medium speed in operation and a minimum delay time $tpd_{min}$ per gate of 20–30 ns. Naturally, this numerical value will change depending on the structure of the IIL in question. It has been reported that in an IIL wherein only the operational speed is taken into consideration a $tpd_{min}$ of several ns can be attained at the sacrifice of the breakdown voltage (in this case, the breakdown voltage is several volts). If the thickness of the epitaxial layer is increased to obtain a breakdown voltage of several tens of volts and if according to the conventional concept the IIL gate is surrounded by the deep collar region of $N^+$-type conductivity, then the resultant $tpd_{min}$ is longer than 50 ns, which falls under the low speed operation.

It is moreover necessary in the large-scale manufacture of such LSI circuits as described above that large manufacturing tolerances can be allowed. In general, an IIL device is constituted mainly of inverse NPN transistors in which the most deeply formed N-type layers are used as emitters, and therefore essentially has a small current gain $\beta i$. Accordingly, if, for example, the base widths of the formed NPN transistors are not uniform, the values of the hFE's of the NPN transistors also become uneven. Therefore, the unevenness of the dimensions of the corresponding constituent regions of the NPN transistors greatly affects parameters such as hFE etc. so that large manufacturing tolerances cannot be obtained for those parameters. In the case of high-breakdown-voltage structures heretofore reported, the manufacturing tolerances are often reduced further than in an ordinary structure. In most of such cases, the large-scale manufacture becomes impossible.

Before the explanation of this invention, two examples of the conventional IIL device will be described concerning their features and drawbacks.

FIG. 1 shows the first exemplary structure which has already been proposed as "phosphorus-buried emitter type IIL device" in the Japanese Patent Application Laid-Open No. 51-116687 which has been assigned to the same assignee as the present invention. In this example, the resistivity of the N-type layer 3 is 1–2 $\Omega$cm and the thickness of the layer 3 is 9–10 $\mu$m so that the breakdown voltage of the NPN transistor is as high as 17–25 V. On the other hand, the phosphorus-buried $N^+$-type layer 22 is formed around the antimony-buried $N^+$-type layer 21 in the IIL section 201 in such a manner that the layer 22 is contiguous with the P-type base region 52. As a result of this arrangement, the thickness of the N-type layer 3 in the IIL section 201 is substantially reduced. In this structure, the N-type layer 3 beneath the base region 52 in the IIL section is replaced by the extended portion of the phosphorus-buried layer 22. Accordingly, the amount of carriers stored beneath the base region 52 is considerably reduced so that the operational speed of the IIL can be improved, the minimum delay time $tpd_{min}$ reaching as small a value as 10 ns.

On the other hand, this structure has the following drawbacks. First, use is made of the difference between the degrees of the up-diffusions in the different materials, i.e. the phosphorus-buried and the antimony-buried layer so that there is a limit to the thickness of the usable N-type layer 3. Therefore, the breakdown voltage is at best about 25 V. Secondly, the degree of the unevenness of the thickness of the N-type layer 3 is substantially the degree of the unevenness of the contact of the phosphorus-buried layer 22 with the base region 52 of the IIL section. It is therefore necessary to precisely control the unevenness of the thickness of the N-type layer 3 within a range of $\pm 5\%$. This results in the increase in the production cost, though to a small extent.

FIG. 2 shows the second example of the conventional IIL (1977 International Electron Device Meeting (IEDM), Technical Digest pages 175–177, "A High-Voltage Analog-Compatible IIL Process" (K. J. Allstot et al)). In this example, phosphorus ions are implanted into that part of the surface of the semiconductor substrate which forms an IIL section, so that an N-type well region 41 is brought into existence. As a result of this N-type well region 41, the impurity concentration in the N-type layer 3 of the IIL section is increased to obtain a sufficient current gain in the IIL section. According to this structure, an NPN transistor having a breakdown voltage of higher than 30 V and an IIL circuit can coexist in a monolithic chip.

The first drawback of this structure, however, is that its operational speed is very low. For, since the impurity concentration of the N-type well 41 is lower than that of the layer 21 or 22, more carriers are stored in the N-type well 41. The resultant minimum delay time is about 40 ns.

The second drawback of this structure is that the manufacturing tolerances for hFE is very small. The reason for this is as follows. In the case, for example, where an N-type layer 3 having a breakdown voltage of 30 V is employed, the gap between the bottom of the P-type base region 52 and the top of the antimony-buried layer 21 is usually longer than 2 $\mu$m. It is therefore necessary to increase the impurity concentration in the gap up to the value for which an injection efficiency necessary for the operation as IIL can be obtained, by the only addition of the impurity concentration of the N-type well thereto. Accordingly, the N-type well 41 here used must have a much higher impurity concentration than these used in MOS IC's. Since this N-type well is formed through the diffusion of impurity from the top surface downward, there naturally exists a gradient of impurity concentration. Therefore, the impurity concentration near the surface of the N-type well becomes higher, that is, as high as nearly $5 \times 10^{16} - 10^{17}$ atoms/cm$^3$. This causes the upper shift of the position of the PN junction in the base region 52 of the IIL section so that the base width of the inverse NPN transistor is lessened, the collector-emitter short-circuit tending to occur. This is why the manufacturing tolerance for the base width must be small. According to the Inventors' experiments, the value for hFE of the NPN transistor 101 could be allowed to be distributed within a range of 200±50 to obtain a breakdown voltage of higher than 30 V. This is very severe requirement in mass production.

SUMMARY OF THE INVENTION

One object of this invention is to provide a semiconductor IC device in which a high-breakdown-voltage element such as, for example, a bipolar transistor having a higher breakdown voltage and an IIL device are integrated in a monolithic semiconductor chip.

Another object of this invention is to provide a semiconductor IC in which a high-breakdown-voltage element and an IIL capable of operating at a high speed are integrated in a monolithic semiconductor chip.

Yet another object of this invenention is to provide a structure for a semiconductor integrated circuit device, according to which the manufacturing margins can be made relatively large when an IIL and a high-breakdown-voltage element are integrated in a monolithic semiconductor chip.

According to the present invention, which has been made to attain the above objects, the following structure is employed to make it possible to integrate in a monolithic semiconductor chip a variety of semiconductor elements which have respectively different requirements for impurity concentrations and thicknesses of the semiconductor layer on the substrate.

Namely, the impurity concentration of the semiconductor layer on a chip is set to a value necessary for the semiconductor layer having the lower concentration while in the formation of the semiconductor layer the thickness of the semiconductor layer is set to value necessary for an element requiring a thicker semiconductor layer. If an element requiring a semiconductor layer with higher impurity concentration is desired, a well having a higher impurity concentration is used which is formed by heavily doping impurity into a desired part of the semiconductor layer from its surface. Then said element is disposed in the well. If an element requiring thinner semiconductor layer is wanted, an up-diffused layer (or buried layer) having a high impurity concentration is used which is formed by up-diffusing heavily impurity into a desired part of the semiconductor layer from its bottom surface. Then said element is disposed in, on or above the up-diffused layer.

With this technique, there can be formed in a chip a high-breakdown-voltage NPN transistor having a breakdown voltage (BV$_{CEO}$) of higher than 60 V and a high-speed IIL having the minimum delay time tpd$_{min}$ of 10 ns and moreover semiconductor IC devices having manufacturing tolerances approximately equal to those for ordinary linear IC's can be produced.

BRIEF DESCRIPTION OF THE DRAWINGS

FIG. 12A shows graphically the distributions of impurity concentrations from the surface of the IIL section to the substrate proper in the structure in FIG. 1.

FIG. 12B shows graphically the distributions of impurity concentrations from the surface of the IIL section to the substrate proper in a structure according to this invention.

FIG. 12C shows graphically the distributions of impurity concentrations from the surface of the IIL section to the substrate proper in a structure according to this invention.

DESCRIPTION OF THE PREFERRED EMBODIMENTS

Figure 1:
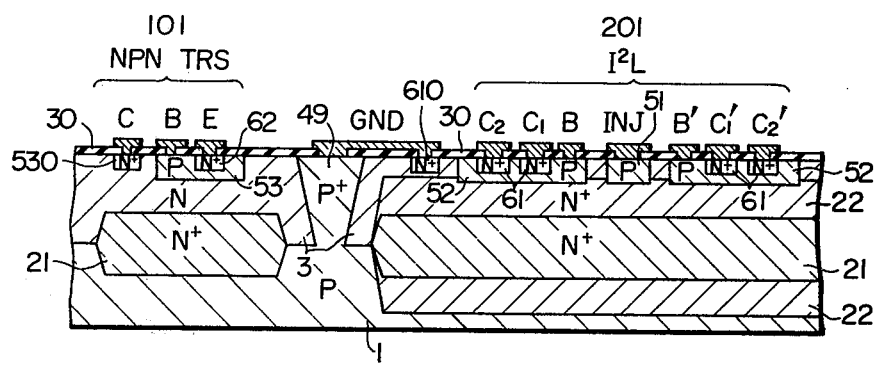
FIG. 1 shows in cross section a conventional semiconductor IC device having a phosphorus-buried layer.

This invention will be described below by way of embodiment.

FIGS. 3, 4A, 4B, 5-9, 11A-11D, and 12A-12C are used to explain the embodiments of this invention and throughout these figures the attached numerals indicate the following items;

1: Si substrate of P-type conductivity (with impurity concentration ranging from nearly non-doped to about $10^{16}$ atoms/cm$^3$)

21: first N$^{30}$-type buried layer using antimony or arseric as impurity

22: second buried (or up-diffused layer using impurity (e.g. phosphorus) having a diffusion coefficient greater than that of the impurity used in the first buried layer 22': phosphorus buried (up-diffused) layer whose shape and impurity concentration are different from those of the layer 22 but optimized.

3: N-type epitaxially grown layer of Si (with impurity concentration ranging from nearly non-doped to $10^{16}$ atoms/cm$^3$)

41: N-type well (having a higher impurity concentration than the layer 3 and formed by ion implantation and drive-in diffusion)

41': N-type well whose shape and impurity concentration are different from those of the well 41 but optimized.

49: P$^+$-type isolation region for isolating one element from another

51: P-type layer serving as an injector in an IIL or SITL

52: P-type layer serving as the base of an IIL (the base of an inverse NPN transistor)

53: P-type layer serving as the base of an NPN transistor

530: N$^+$-type layer serving as a collector contact for an NPN transistor

55: P-type region serving as the gate of an SITL

61: N$^+$-type layer serving as the collector of an inverse NPN transistor in IIL 610: N$^+$-type layer serving as a ground terminal for IIL 62: N$^+$-type layer serving as the emitter of the NPN transistor 64: N$^+$-type layer serving as the drain of the SITL 101: NPN transistor 102: NPN transistor with collector resistance lowered by means of the N-type well 41'

103: NPN transistor with collector resistance lowered further by means of N-type well 41 provided widely 104: NPN transistor with collector resistance lowered further by means of phosphorus buried layer 22' and N-type well 41'

105: NPN transistor with collector resistance lowered further by means of phosphorus buried layer 22' and N-type well 41' both widely provided 201: IIL circuit 401: SITL circuit

[EMBODIMENT 1]

Figure 3:
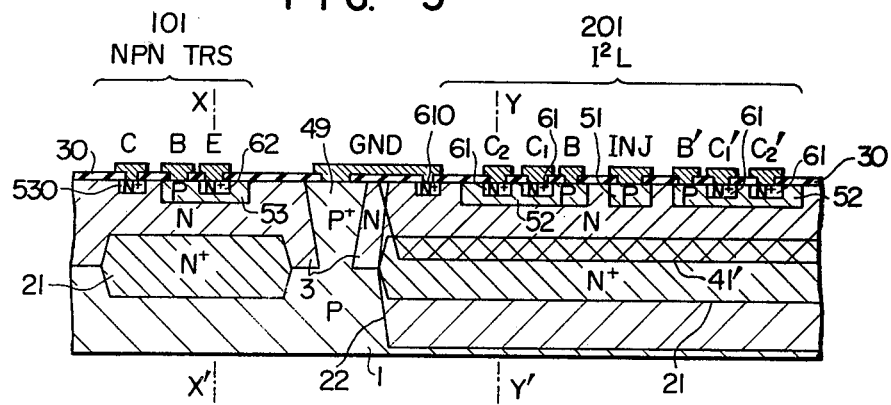
FIG. 3 shows in cross section an IIL section and an NPN transistor section in a semiconductor IC device as one embodiment of this invention.
Figure 4A:
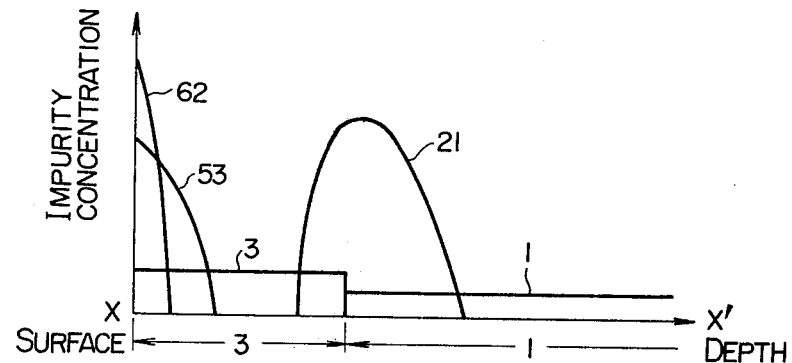
FIG. 4A shows graphically the distribution of impurity concentration along the line X-X' in FIG. 3.
Figure 4B:
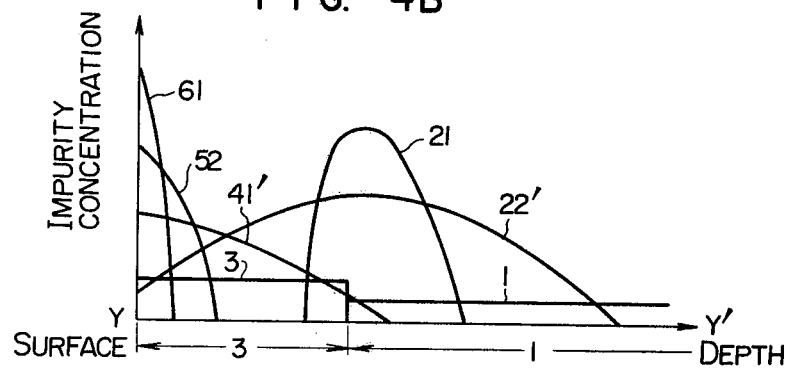
FIG. 4B shows graphically the distribution of impurity concentration along the line Y-Y' in FIG. 3.

FIG. 3 shows in cross section one embodiment of this invention. In this embodiment, by employing new phosphorus buried layers 22' and N-type wells according to this invention in an IIL section 201, a high breakdown voltage can be obtained, a high operational speed can be attained, and the manufacturing tolerances can be broadened. FIG. 4A shows the distribution of impurity concentration along the line X–X' in the NPN transistor section 101 in FIG. 3 and FIG. 4B shows the distribution of impurity concentration along the line Y–Y' in the IIL section 201 in FIG. 3.

In this embodiment, the phosphorus buried layer 22' extends from the bottom of the semiconductor layer 3 up to the top surface of the substrate 1, as shown in FIG. 3. The distribution of the impurity concentration through the layer 22' is represented by a curve labeled 22' in FIG. 4B. The phosphorus buried layer 22' is an upper-diffused layer in the form of N-type region having a relatively wide extension and a high impurity concentration. The impurity concentration of the layer 22' is lower than that of the layer 22 shown in FIG. 1 and the maximum value of the impurity concentration of the layer 22' is of the order of $10^{17}$ atoms/cm$^3$. Accordingly, this up-diffused layer 22' of N-type conductivity (phosphorus buried layer) alone can only provide a gain slightly less than the gain necessary for the operation of the IIL.

Figure 2:
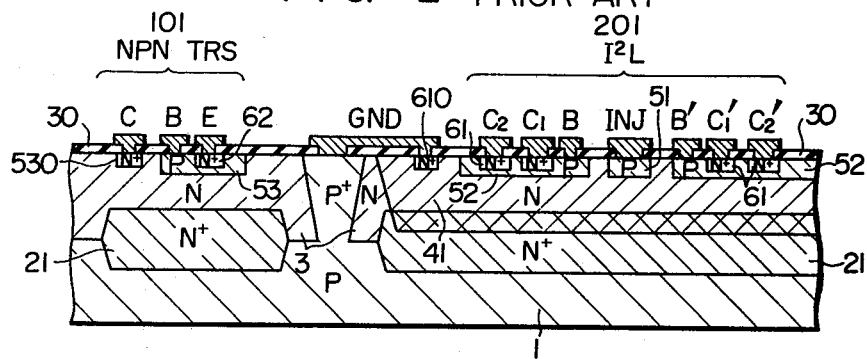
FIG. 2 shows in cross section a conventional semiconductor IC device having a well region.

The N-type well 41' in this embodiment has an impurity concentration equal to about one third of the impurity concentration of the N-type well 41 in the conventional structure shown in FIG. 2. The surface impurity concentration of the N-type well 41' is about $1-2\times10^{16}$ atoms/cm$^3$ and therefore insufficient for the operation of the IIL.

If, however, the N-type up-diffused layer 22' from the bottom of the semiconductor layer 3 and the N-type well 41' diffused from the top surface of the layer 3 are jointly used, an improved characteristic beyond expectation can be obtained with new results as follows.

First, the impurity concentration in the intervering region between the base 52 and the antimony buried layer 21 is sufficiently increased as a result of the impurity concentrations of the layer 21' and the well 41' being added together so that the IIL operates very well. Further, the impurity concentration of the intervening region is sufficiently higher than that of the N-type layer 3, the impurity concentration of the layer 3 can be set to an orbitrarily small value according to the requirement for the breakdown voltage. Therefore, a sufficiently high breakdown voltage can be achieved. In this embodiment, the IIL operates very well while the maximum breakdown voltage BV$_{CEO}$ of the NPN transistor 101 is 65 V. This exhibits a considerable improvement in breakdown voltage.

Secondly, the provision of the N-type up-diffused layer (phosphorus buried layer) 22' reduces the amount of stored carriers and therefore results in a high speed operation. The observed minimum delay time is 9.5 ns (at best). This is the evidence of the realization of the speed-up of the operation as well as the high breakdown voltage.

Thirdly, a noteworthy feature newly introduced by the adoption of the structure described above is the relaxation of the manufacturing tolerances.

One of the causes of the tolerance relaxation is, as described before, that the N-type up-diffused layer (phosphorus buried layer) 22' is used in this embodiment has a lower impurity concentration and an easy gradient of concentration. Accordingly, even though the degree of contact between the base 52 of the IIL and the N-type up-diffused layer 22' varies owing to the unevenness in the thickness of the N-type layer 3 or the up-diffusion for the formation of the up-diffused layer 22', the width of the base of the IIL is little changed. Therefore, there is only a little probability that a collector-emitter short-circuiting occurs in the IIL. This permits a relatively large manufacturing tolerance for the thickness of the N-type layer 3. In this embodiment, an unevenness in the thickness of the N-type layer 3 within $\pm10\%$ can be accepted. This range of tolerance equals the standard one used for epitaxial layers of linear IC's in general use and is almost twice as large as the manufacturing tolerance of the conventional structure shown in FIG. 1.

The second cause of the tolerance relaxation is that since the impurity concentration of the N-type well used in this embodiment is as low as about one third of the conventional structure in FIG. 2, the collector-emitter short-circuiting seldom occurs in the IIL. Accordingly, the tolerance for the hFE of the NPN transistor 101 can be relaxed. According to this embodiment, the IIL operates well when the hFE of the NPN transistor 101 is in a range of 100-300. This range almost equals the standard one for linear IC's in general use and therefore is considered to be a great improvement in case of an IIL.

As described above, according to this embodiment which employs a new conception different from the conventional one, that is, an idea of the joint use of the phosphorus buried layer and the N-type well, an effect much greater than the resultant one obtained when the phosphorus buried layer and the N-type well are separately used, can be obtained with an additional relaxation of the manufacturing tolerances.

The Inventor's experiments have revealed that if the N-type well 41' is eliminated from the structure of this embodiment, the inverse current gain $\beta i$ falls by a factor of 4 and that if the phosphorus buried layer 22' is removed from the structure, $\beta i$ is reduced by a factor of 8. In both the cases, the IIL cannot be operated. Moreover, the mere combination of the conventional phosphorus buried layer 22 and the N-type well 41 as used in the prior art structures shown in FIGS. 1 and 2 never adds to the tolerances for the unevenness of the thickness of the N-type layer 3 or of hFE of the NPN transistor. Namely, the remarkable feature of this invention is the joint use of the phosphorus buried layer and the N-type well each of which is modified in shape and therefore different in geometry from the conventional equivalents. The lack of each of the members causes the IIL to be inoperable, both members being essential, and only the joint use of the members will produce the above described splendid results.

Further, in this embodiment, the antimony buried layer 21 and the phosphorus buried layer 41' are used in superposition in the IIL section 201. This configuration serves to reduce the sheet resistivity through the overlapped region. In this embodiment, the sheet resistivities of the antimony and phosphorus buried layers 21 and 22' are 10-30 $\Omega/\square$ and 50-100 $\Omega/\square$, respectively. Accordingly, the effect of the superposition of these layers 21 and 22' is the reduction in the resultant sheet resistivity and therefore the realization of a buried layer having a lower resistivity. This result, however, is not the gist of the present invention, but merely a secondary effect. It is, therefore, to be noted that even though the IIL section has no antimony buried layer 21, the effect of this invention can be enjoyed.

Other advantageous effects attained by this invention are as follows. First, the thermal diffusion process for forming the P+-type isolation region 49 can be performed simultaneously with the heat treatment for the drive-in diffusion of the N-type well 41' and the phosphorus buried layer 22'. Secondly, the photo-mask for the formation of the N-type well 41' and the phosphorus buried layer 22' may be the photo-mask for defining the outer boundary of the IIL section so that the photomask need not have so high a precision. Moreover, if the N-type well is formed by ion implantation, the precision of the concentration of the doped impurity is so high that an N-type well having a high precision can be obtained. This serves to relax the tolerances for other parameters. It should, however, be noted that the ion implantation is not the only method for forming the N-type well, but may be replaced by an ordinary diffusion process with deposition step. An advanced high-precision deposition technique would be especially suitable for the formation of an N-type well having a high precision.

FIGS. 11A, 11B, 11C and 11D show the steps of a process for producing the first embodiment of this invention shown in FIG. 3. The steps will be explained below in the actual order.

(A) On a P-type silicon substrate 1 having a thickness of 400 $\mu m$ and an impurity concentration of about $10^{14}$ atoms/cm$^3$ is deposited an insulating mask in the form of a thin silicon dioxide, silicon nitride or aluminum oxide film having a desired characteristic through thermal oxidation method, chemical vapor deposition (CVD) method or any of other suitable methods. Then, an N+-type buried layer 21 having a thickness of 2-10 $\mu m$ and a sheet resistivity of 10-50 $\Omega/\square$ is formed in desired portions of the silicon substrate 1 by diffusing impurity such as antimony or arsenic from the surface of the substrate 1 (see FIG. 11A).

Figure 11A:
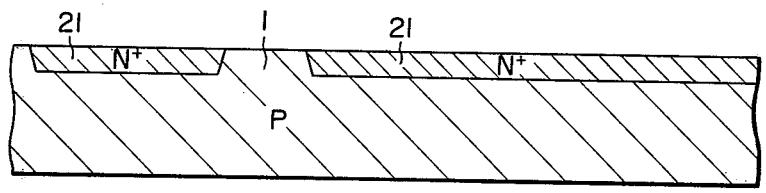
FIGS. 11A, 11B, 11C and 11D show the steps of a process for producing a semiconductor IC device according to this invention.
Figure 11B:
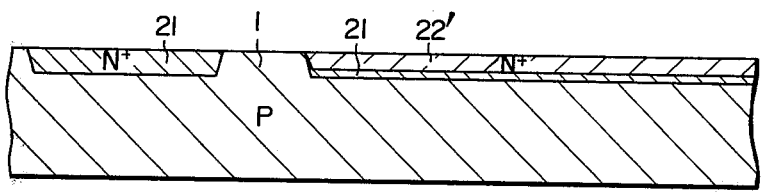

(B) On the part of the surface of the above prepared structure where a second buried layer 22' is to be formed, is deposited through an insulating mask a layer of N-type impurity such as phosphorus having a greater diffusion coefficient than antimony or arsenic by a vapor phase deposition method or an ion implantation method performed for a predetermined time. Through drive-in diffusion at 900°-1300° C., the second buried layer 22' having a sheet resistivity $\rho_s$ of 10-1000 $\Omega/\square$ and a diffusion depth of 1-20 $\mu m$ is completed (FIG. 11B).

Figure 11C:
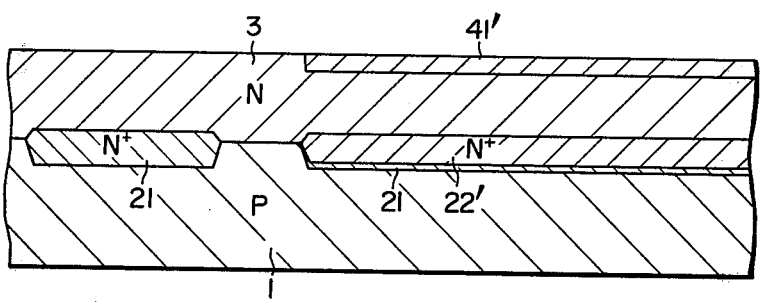

(C) After removing the insulation mask, it is desired to form an N-type silicon layer 3 having an impurity concentration of $10^{15}$ atoms/cm$^3$ and a thickness of 2-20 $\mu m$ by, for example, epitaxial growth technique. During the growth of the N-type layer 3, the first and second buried layers 21 and 22' of N+-type extend into the N-type layer 3 up to a depth of 0.2-2 $\mu m$ through diffusion of impurity. Then, phosphorus serving as N-type impurity is deposited at a concentration of $10^{10}$-$10^{14}$ atoms/cm$^2$ in a desired portion 41' of the N-type layer 3 by, for example, ion implantation (FIG. 11C).

Figure 11D:
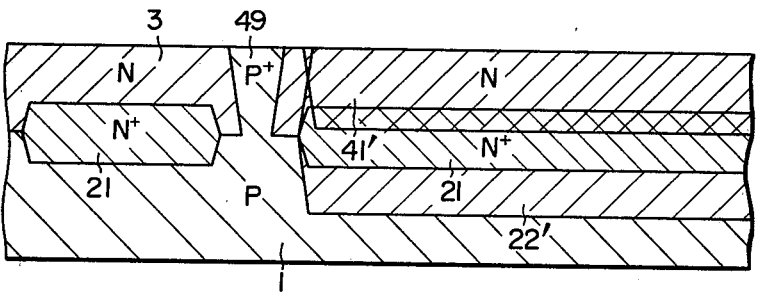

(D) A P+-type insulation region 49 is formed by, for example, the well-known boron diffusion. In this diffusion process, boron is diffused at 900°-1300° C. for 10-1000 minutes. During this diffusion, the N-type Layer 41' and the second buried layer 22' are also extended further through drive-in diffusion (FIG. 11D).

Thereafter, P-type layers (51, 52, 53 etc.), N+-type layers (61, 62, 530, 610 etc.) and an insulating film 30 are formed by the well-known process for fabricating semiconductor IC's and the metallization (C, B, E, GND, C$_1$, C$_2$, B, INJ, B', C$_1$', C$_2$') is performed so that the structure shown as the first embodiment in FIG. 3 is obtained.

Figure 5:
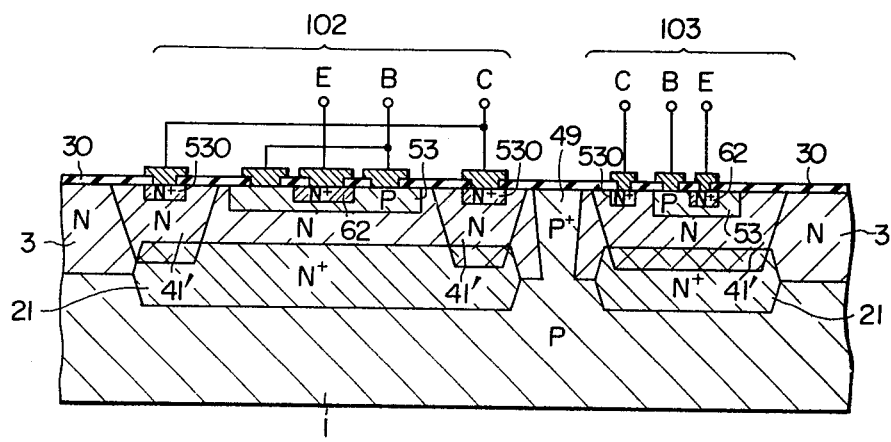
FIGS. 5, 6 and 7 show in cross section structures other than the IIL and the NPN transistor in the monolithic chip of the semiconductor IC device shown in FIG. 3.

FIG. 5 shows in cross section another part of the semiconductor chip shown as carrying the first embodiment of this invention in FIG. 3. Reference numeral 102 designates a bipolar transistor having a high breakdown voltage and a reduced collector resistance (in this case it is a power transistor). An N-type well 41' is formed only around the collector terminal so as to reduce the collector resistor.

Numeral 103 indicates an NPN transistor, in which an N-type well 41' is formed covering the whole active region of the transistor 103. This NPN transistor 103 has not a high breakdown voltage but has its collector resistor reduced.

Figure 6:
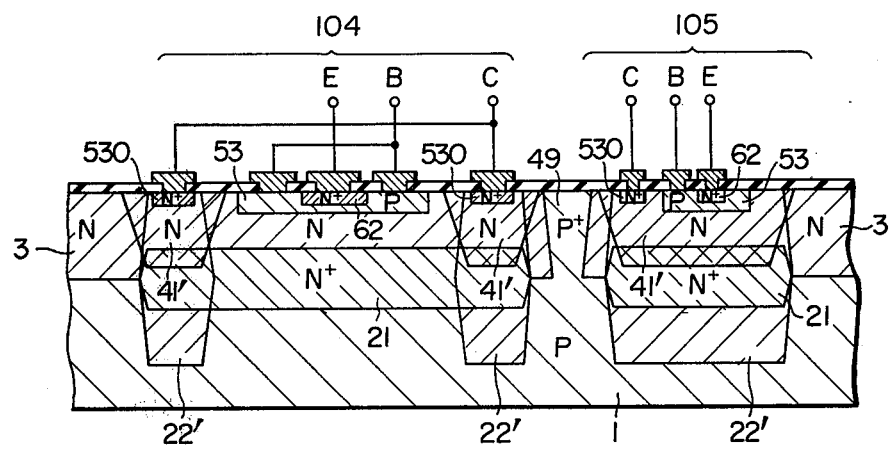

FIG. 6 shows in cross section still another part of the semiconductor chip shown as carrying the first embodiment of this invention in FIG. 3. An NPN transistor 104 has a much lower collector resistance than the transistor 102. In addition to the N-type well 41' a phosphorus buried layer 22' is formed around the collector terminal so as to further decrease the collector resistor.

An NPN transistor 105 has a much lower collector resistance than the NPN transistor 103, in which a phosphorus buried layer 22' is formed covering the whole active region of the NPN transistor 105 in addition to the N-type well 41'.

Figure 7:
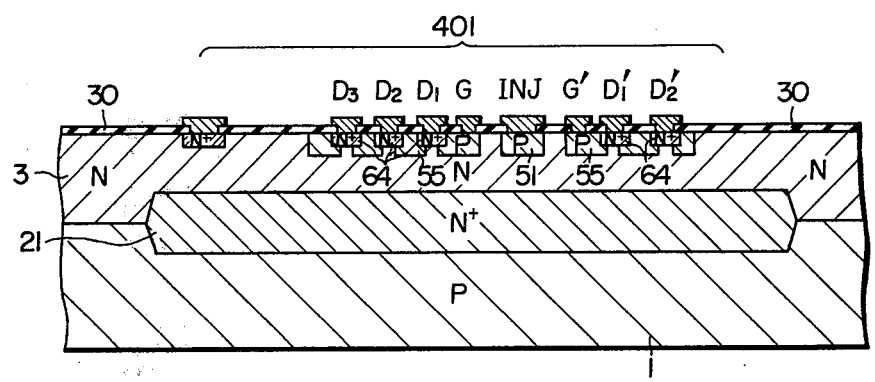

FIG. 7 shows in cross section yet another part of the semiconductor chip shown as carrying the first embodiment of this invention in FIG. 3. Reference numeral 401 designates an SITL (or SIL) reported as a logic circuit using static induction transistors (SIT). In this structure, the impurity concentration of the N-type layer 3 can be controlled to a sufficiently small value, and so an SITL requiring an N-type layer having a low impurity concentration can be realized.

Moreover, since the impurity concentration of the N-type layer 3 can be chosen to be sufficiently small, it is apparent that a P-MOS transistor circuit can be formed on the N-type layer 3 and that if a P-type well is formed by, for example, ion implantation, an N-MOS transistor circuit can also be formed on the layer 3.

[EMBODIMENT 2]

Figure 8:
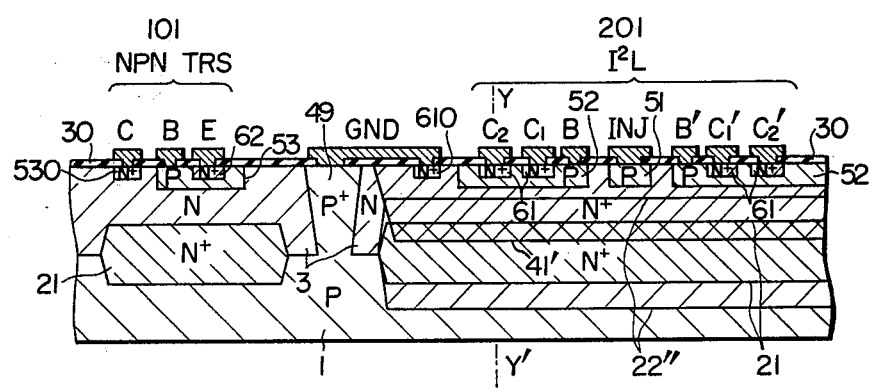
FIG. 8 shows in cross section an IIL section and an NPN transistor section of a semiconductor IC device as a second embodiment of this invention.
Figure 9:
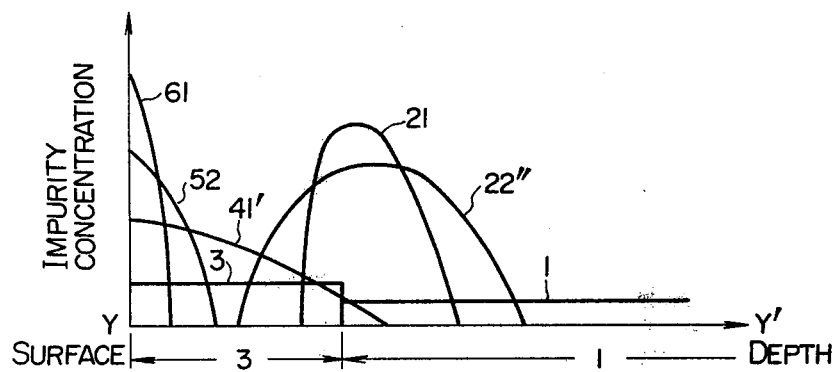
FIG. 9 shows graphically the distribution of impurity concentration along the line Y-Y' in FIG. 8.

FIG. 8 shows in cross section a second embodiment of this invention and FIG. 9 shows the distribution of impurity concentration along the line Y-Y' in FIG. 8. The only difference of this embodiment from the first embodiment shown in FIG. 3 is the shape of the up-diffusion layer (phosphorus buried layer) 22''. The feature of this up-diffusion layer (phosphorus buried layer) 22'' is that it is spaced from the base 52 of the IIL, as shown in FIG. 9. The effect of this layer 22'' is enhanced by increasing the value at the peak of the impurity concentration and the gradient of the impurity concentration. Such a structure as suggested above can be easily obtained by controlling the conditions for deposition and the time of thermal diffusion. The other parts of the structure are the same as those of the structure as the first embodiment of this invention.

This second embodiment has the following merit. Since the N-type up-diffused layer (phosphorus buried layer) 22'' is provided spaced from the base 52, the width of the base of the IIL is not decreased even if the thickness of the N-type layer 3 and the up-diffusion for the formation of the layer 22'' become irregular. Accordingly, the manufacturing tolerances for these can be set rather large. Namely, all the results obtained by the first embodiment can also be obtained by this second embodiment.

The ideas common to the first and the second embodiment are summarized as follows. First, there are used two kinds of buried layers whose degrees of up-diffusion are different from each other. Namely, the antimony buried layer and the phosphorus buried layer are used and the degrees of up-diffusion is made different from each other by utilizing the difference in thermal diffusion coefficient between antimony and phosphorus. However, the difference in material is not essential. For the same effect can be obtained also by making the degrees of up-diffusion different through the repeated diffusion of impurity in a desired area. Anyway, essential is the difference in the degree of up-diffusion and the characteristic of each of the high-breakdown-voltage transistor and the IIL can be optimized by controlling the difference in the degree of up-diffusion for the individual cases.

Figure 10A:
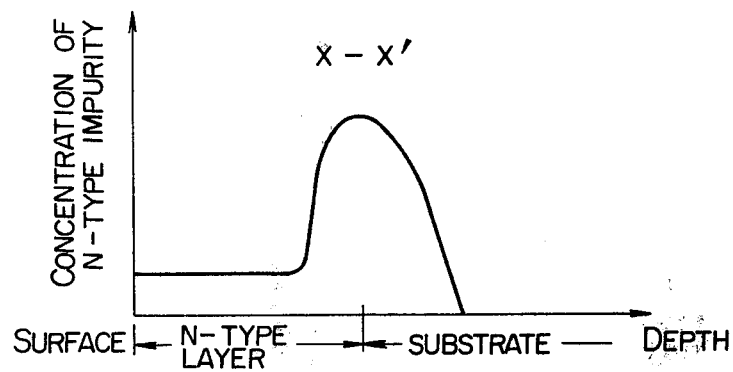
FIG. 10A and 10B show graphically the distributions of N-type impurity concentrations in the N-type layer of the semiconductor IC device according to this invention.
Figure 10B:
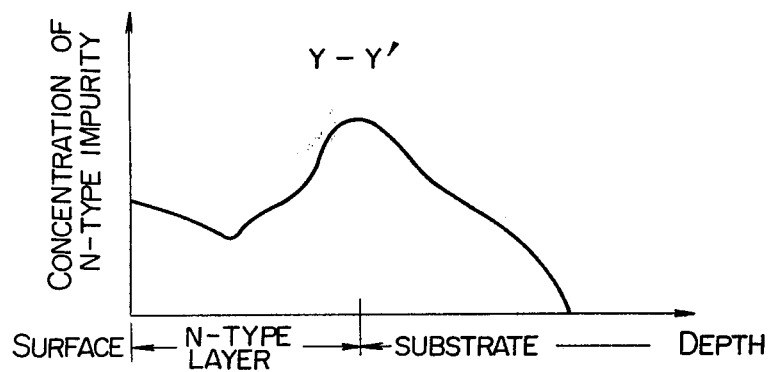

Secondly, an N-type well is formed by diffusing impurity from the surface in the region, e.g. IIL section, where an N-type layer having a relatively high impurity concentration is to be formed. The distribution of impurity concentration by which an unprecedented result can be obtained, is realized by the combination of the N-type well and the above buried layer. More particularly, this invention can be considered to be an integrated circuit characterized in that the two N-type layers whose distributions of impurity concentrations are as shown respectively in FIGS. 10A and 10B, are formed in a monolithic semiconductor chip. The N-type layer having such a distribution of impurity concentration as shown in FIG. 10A should be used in an element which needs a thick N-type layer having a low impurity concentration while the distribution shown in FIG. 10B is for an element which needs a thin N-type layer having a high impurity concentration. As shown in FIG. 10B, according to this invention, there is a depression of concentration near the middle point of the depth of the N-type layer and the impurity concentration increases from the middle point toward either surface or substrate. For example, in the case of the IIL, the increase in the concentration toward the substrate increases the operational speed while the impurity concentration added from the surface adds to the current gain.

That is, the feature of this invention is that the distribution of relatively high N-type impurity concentration with a depression in the middle point and the distribution of low N-type impurity concentration are jointly used in the monolithic chip.

FIGS. 12A, 12B and 12C show the distributions of impurity concentrations in the conventional structures and the structure according to this invention. FIG. 12A corresponds to the first conventional structure and FIG. 12B is the reproduction (of FIG. 3(*b*)) from Digest of Technical Papers 9.3, "A High-Voltage Analog-Compatible IIL Process", D. J. Allstot et al, 1977, International Electron Device Meeting (IEDM). Thick solid curves 121, 122 and 123 designate the synthesized N-type impurity concentrations in the respective structures on the assumption that the base 52 and the N+-type layer 61 are eliminated. In the structure shown in FIG. 12A, the impurity concentration in the layer 22 is very high so as to obtain a sufficient gain in the IIL. In the structure shown in FIG. 12B, the impurity concentration in the layer 41 is also very high for the same reason as above. It is therefore apparent from the figures that the manufacturing tolerances are small. On the other hand, in the structure shown in FIG. 12C, according to this invention, the synthesized N-type impurity concentration 123 takes a moderate value near the position where the superposed N-type layer comes into contact with the base 52. This structure is characterized in that the N-type impurity concentration increases (or at least continues to be constant) from the position (indicated at 124 in FIG. 12C) beneath the base layer 52 toward the surface and also that it increases from the position 124 toward the substrate. Only with this structure, a high-speed IIL can be integrated in a high-breakdown-voltage LSI circuit without abnormally increasing the N-type impurity concentration at the point 124.

Figure 13:
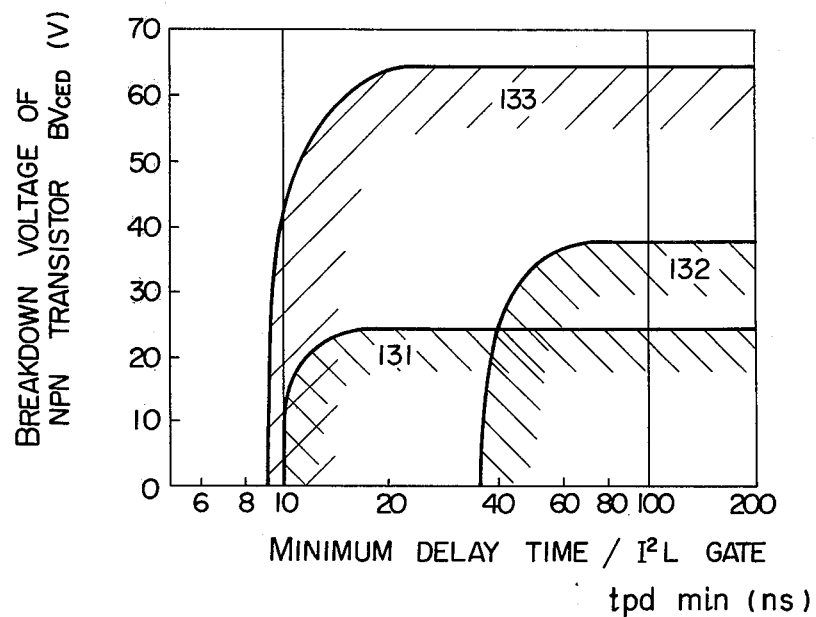
FIG. 13 shows comparatively the relationships between the breakdown voltage and the minimum delay time, in the semiconductor IC devices according to the conventional technical spirit and to this invention.

FIG. 13 comparatively shows the performances of the conventional structures and the structure according to this invention (the first conventional structure: 131; the second conventional structure: 132; and the structure according to this invention: 133). The structure according to this invention exhibits a performance (tdp$_{min}$≳9.5 ns and BV$_{CEO}$>60 V) superior to the combined performances (tpd$_{min}$≳10 ns and BV$_{CEO}$≲40 V) of the first and the second structure.

Figure 14:
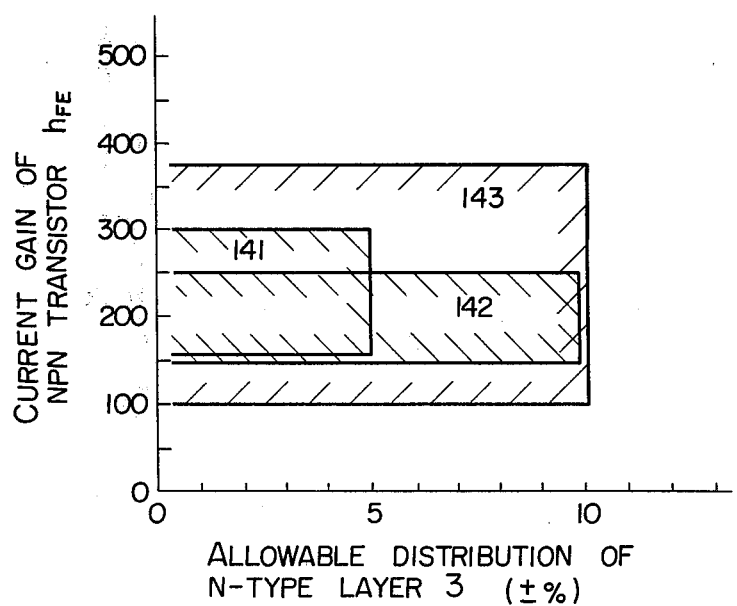
FIG. 14 comparatively shows the manufacturing tolerances according to the conventional technical spirit and to this invention.

FIG. 14 comparatively shows the manufacturing tolerances for the conventional structures and the structure according to this invention (the first conventional structure: 141; the second conventional structure: 142 and the structure according to this invention: 143). The abscissa represents in % value the allowable distribution of the thicknesses (d in FIG. 12) of the N-type layer(s) 3 and the ordinate the tolerance for h$_{FE}$ of the NPN transistor in the linear section. It is seen from FIG. 14 that this invention has contributed much to the improvement in the manufacturing tolerances.

As described above, according to this invention, a variety of elements having different requirements for their component layer thicknesses and the associated impurity concentrations can be arbitrarily integrated in a monolithic chip. In that case, the impurity concentration of the layer 3 is controlled in view of one of all the integrated elements which includes the lowest impurity concentration while the thickness of the layer 3 is chosen in view of an element which includes the thickest layer. If it is necessary to form an element including an impurity concentration higher than that of the layer 3, well 41 or 41' is formed by, for example, ion implantation. If it is desired to form an element including a layer thinner than the layer 3, up-diffused layer may be provided.

Thus, this invention can provide a remarkable effect that semiconductor IC's such as a bipolar transistor circuit, an IIL and an SITL circuit can be integrated in a monolithic chip while the performances of the individual circuits are optimized.

It should be appreciated that numerous variations and modifications are likely to occur to those skilled in the art without departing from the scope and the spirit of this invention. For example, in the above embodiments, the conductivity types of all the layers may be inverted and in that case the same result can also be obtained.

We claim:

1. A semiconductor IC device in which a semiconductor layer formed on a semiconductor substrate of a first type conductivity and having a second type impurity concentration higher than the non-dope concentration thereof, is divided into plural island regions by an isolation region of insulating material or semiconductor having said first type conductivity and an integrated injection logic (IIL) circuit is formed in a first one of said plural island regions, wherein a well region is formed from the surface of said first island region down, said well region having said second type conductivity and an impurity concentration higher than that of said semiconductor layer; an up-diffused region is formed from the bottom of said first island region up, said up-diffused region having said second type conductivity and an impurity concentration higher than that of said semiconductor layer; and a buried layer is formed near the bottom of said island region, said buried region having said second type conductivity and an impurity concentration higher than that of said up-diffused region.

2. A semiconductor IC device as claimed in claim 1, wherein said up-diffused region overlaps said well region.

3. A semiconductor IC device as claimed in claim 2, wherein said up-diffused layer formed from the bottom of said first island region up, is so extended by drive-in diffusion as to reach the surface of said island region.

4. A semiconductor IC device as claimed in claim 3, wherein the peak impurity concentration in said up-diffused region is of the order of $10^{17}$ atoms/cm$^3$.

5. A semiconductor IC device as claimed in claim 4, wherein the surface impurity concentration in said well region is about $1-2\times10^{16}$ atoms/cm$^3$.

6. A semiconductor IC device as claimed in claim 1, wherein the diffusion coefficient of said second type impurity doped in said up-diffused region is greater than that of said second type impurity doped in said buried region.

7. A semiconductor IC device as claimed in claim 1, wherein an element other than an IIL is formed in a second one of said plural island regions.

8. A semiconductor IC device as claimed in claim 7, wherein said element is at least one of a bipolar transistor, a MOS transistor and a static induction transistor.

9. A semiconductor IC device having a semiconductor substrate of a first type conductivity, a semiconductor layer of a second type conductivity opposite to said first type conductivity and an isolation region for dividing said semiconductor layer into plural island regions, in a first one of which an IIL is formed, wherein said first island region comprises:

a first impurity-doped region of said second type conductivity, having an impurity concentration higher than that of said semiconductor layer and the peak in concentration at the bottom of said first island region;

a second impurity-doped region of said second type conductivity, having an impurity concentration higher than that of said first impurity-doped region and the peak in concentration at the bottom of said first island region; and a third impurity-doped region of said second type conductivity having an impurity concentration higher than that of said semiconductor layer and the peak in concentration at the main surface of said semiconductor layer and at least partially overlapping said first impurity-doped region, wherein said IIL is formed in said third impurity-doped region.

10. A semiconductor IC device as claimed in claim 9, wherein said first impurity-doped region extends from the bottom up to the main surface, of said semiconductor layer.

11. A semiconductor IC device as claimed in claim 9 or 10, wherein said first and third impurity-doped regions overlap each other near the bottom of the region which has said first type conductivity and serves as the base of an inverse NPN transistor in said IIL.

12. A semiconductor IC device as claimed in claim 9, wherein said first and third impurity-doped regions have phosphorus as their impurity and said second impurity-doped region has at least one of antimony and arsenic as its impurity.

13. A semiconductor IC device as claimed in claim 9, wherein at least one of a bipolar transistor, an insulated-gate FET and a static induction transistor is formed in a second one of said plural island regions.

14. A semiconductor IC device as claimed in claim 9, wherein said first impurity-doped region extends from the bottom of said semiconductor layer up to the vicinity of the region which has said first type conductivity and serves as the base of an inverse NPN transistor in said IIL.

* * * * *